US008714141B2

(12) United States Patent
Nakamura

(10) Patent No.: US 8,714,141 B2
(45) Date of Patent: May 6, 2014

(54) MULTI-LAYER PIEZOELECTRIC ELEMENT, AND INJECTION DEVICE AND FUEL INJECTION SYSTEM COMPRISING THE SAME

(75) Inventor: Shigenobu Nakamura, Kirishima (JP)

(73) Assignee: Kyocera Corporation, Kyoto (JP)

( * ) Notice: Subject to any disclaimer, the term of this patent is extended or adjusted under 35 U.S.C. 154(b) by 314 days.

(21) Appl. No.: 13/254,801

(22) PCT Filed: Feb. 24, 2010

(86) PCT No.: PCT/JP2010/052864
§ 371 (c)(1),
(2), (4) Date: Oct. 20, 2011

(87) PCT Pub. No.: WO2010/101056
PCT Pub. Date: Sep. 10, 2010

(65) Prior Publication Data
US 2012/0024980 A1 Feb. 2, 2012

(30) Foreign Application Priority Data
Mar. 4, 2009 (JP) .................................. 2009-050085

(51) Int. Cl.
*F02M 51/00* (2006.01)
*F02M 51/06* (2006.01)

(52) U.S. Cl.
USPC .......................................... 123/498; 123/490

(58) Field of Classification Search
USPC ....................... 123/498, 490, 478; 239/102.2; 310/316.03, 317, 323.06, 311, 310/363–367, 313 A
See application file for complete search history.

(56) References Cited

U.S. PATENT DOCUMENTS

| 4,056,742 | A | * | 11/1977 | Tibbetts | 310/357 |
| 6,091,180 | A | | 7/2000 | Unami et al. | |
| 6,411,015 | B1 | * | 6/2002 | Toda | 310/334 |
| 7,268,471 | B2 | | 9/2007 | Riemer | |
| 7,538,475 | B2 | * | 5/2009 | Ohmori et al. | 310/328 |

(Continued)

FOREIGN PATENT DOCUMENTS

CN 1213893 A 4/1999
EP 1476907 11/2004
(Continued)

OTHER PUBLICATIONS

Japanese language office action and its Statement of Relevance of Non-English References pursuant to 37 CFR 1.98 (a)(3)(i) issued in corresponding Japanese application 2011502720 cites the foreign patent document listed above.

(Continued)

*Primary Examiner* — Mahmoud Gimie
(74) *Attorney, Agent, or Firm* — DLA Piper LLP (US)

(57) ABSTRACT

Provided is a highly durable multi-layer piezoelectric element wherein a conductive connection member is not broken even in the case of continuous driving for a long period in a high electric field under high pressure.

A multi-layer piezoelectric element includes a stacked body configured so that piezoelectric layers and internal electrode layers are alternately laminated, an external electrode bonded to a side surface of the stacked body and electrically connected to the internal electrode layers, and a conductive connection member which is disposed on a surface of the external electrode and of which surface has projections and depressions formed repeatedly at least in a stacked direction of the stacked body.

12 Claims, 9 Drawing Sheets

(56) References Cited

U.S. PATENT DOCUMENTS

| | | |
|---|---|---|
| 2001/0047796 A1 | 12/2001 | Yamada et al. ............... 123/498 |
| 2005/0116220 A1 | 6/2005 | Riemer ........................ 257/40 |
| 2005/0120528 A1 | 6/2005 | Okuda et al. ................ 29/25.35 |

FOREIGN PATENT DOCUMENTS

| | | |
|---|---|---|
| JP | 2002-061551 | 2/2002 |
| JP | 2004087729 A | 3/2004 |
| JP | 2005-174974 | 6/2005 |
| JP | 2005-518676 | 6/2005 |
| JP | 2006-216850 | 8/2006 |
| JP | 2008-211054 | 9/2008 |

OTHER PUBLICATIONS

Chinese language office action dated May 22, 2013 and its English language Statement of Relevance of Non-English References Pursuant to 37 CFR 1.98(a)(3)(i) issued in corresponding Chinese application 201080009913 cites the foreign patent documents listed above.

* cited by examiner (a)

(b)

(c)

(d)

MULTI-LAYER PIEZOELECTRIC ELEMENT, AND INJECTION DEVICE AND FUEL INJECTION SYSTEM COMPRISING THE SAME

CROSS-REFERENCE TO THE RELATED APPLICATIONS

This application is a national stage of international application No. PCT/JP2010/052864, filed on Feb. 24, 2010, and claims the benefit of priority under 35 USC 119 to Japanese Patent Application No. 2009-050085, filed on Mar. 4, 2009, the entire content of which are incorporated herein by reference.

TECHNICAL FIELD

The present invention relates to a multi-layer piezoelectric element for use in, for example, a driving element (piezoelectric actuator), a sensor element, circuit element, and so forth, as well as to an injection device and a fuel injection system comprising the multi-layer piezoelectric element.

BACKGROUND ART

As disclosed in Patent literature 1, a conductive paste comprising a conductive material, such as silver, and glass has been used for an external electrode of a multi-layer piezoelectric element of the related art. The external electrode is formed by applying the conductive paste to a side surface of a stacked body, followed by baking treatment. Moreover, a lead member for the supply of voltage to the external electrode is fixedly connected to the external electrode exteriorly thereof by means of solder, a conductive adhesive, or the like.

CITATION LIST

Patent Literature

Patent literature 1: Japanese Unexamined Patent Publication JP-A 2005-174974
Patent literature 2: Japanese Unexamined Patent Publication JP-A 2002-61551

DISCLOSURE OF INVENTION

Technical Problem

However, in a multi-layer piezoelectric element employing the external electrode as described in Patent literature 1, such a problem arises that when it is used under harsh conditions, for example, when it is operated in the presence of high electric field or high pressure, or subjected to continuous driving for long hours, the external lead member fixedly connected to the external electrode is liable to separation, thus causing interruption in the supply of voltage to the external electrode, with a result that the multi-layer piezoelectric element ceases displacement.

Especially in the case of driving the multi-layer piezoelectric element at high speed while increasing its displacement distance, it can be considered that the multi-layer piezoelectric element is used in a compressed state under a load in advance. However, if the multi-layer piezoelectric element in this state is subjected to continuous driving, tensile and compressive stresses are applied repeatedly from the external lead member fixedly connected to the multi-layer piezoelectric element, in consequence whereof such a problem arises that the external lead member is further liable to separation.

Meanwhile, in the case of driving the multi-layer piezoelectric element at high speed while passing a large electric current, it can be considered that the thickness of the external electrode is increased. However, if the external electrode is only made thicker, stress due to driving is increased, in consequence whereof such a problem arises that the external electrode is separated from the side surface of the stacked body or breaking occurs.

Instead of increasing the thickness of the external electrode, as disclosed in Patent literature 2, it is possible to adopt a structure in which a second external electrode is additionally placed on a flat surface of a first external electrode. However, even in this structure, when driven to operate for a long period of time under a high electric field condition or driven continuously with greater displacement, such a problem arises that a crack developed in the first external electrode may propagate to the second external electrode, and after all, the external electrode is liable to breaking, thus causing interruption in the supply of voltage to part of the piezoelectric body, with consequent deterioration in displacement characteristics.

Furthermore, in the case of passing a large electric current through the external electrode to perform high-speed driving, such a problem arises that the external electrode generates heat, thus causing thermal breakdown.

The invention has been devised in view of the problems associated with the related art as mentioned above, and accordingly an object of the invention is to provide a multi-layer piezoelectric element that is free from breaking of an external electrode, separation of the external electrode from a side surface of a stacked body, separation of an external lead member from the external electrode, and thermal breakdown of the external electrode even under harsh operating conditions.

Solution to Problem

The invention provides a multi-layer piezoelectric element, comprising:
a stacked body configured so that piezoelectric layers and internal electrode layers are alternately laminated;
an external electrode bonded to a side surface of the stacked body and electrically connected to the internal electrode layers; and
a conductive connection member attached to a surface of the external electrode,
a surface of the conductive connection member comprising projections and depressions formed repeatedly at least in a stacked direction of the stacked body.

In the multi-layer piezoelectric element of the invention, it is preferable that the projections and depressions are arranged periodically in the stacked direction of the stacked body.

Moreover, in the multi-layer piezoelectric element of the invention, it is preferable that the surface of the external electrode comprises projections and depressions formed repeatedly in the stacked direction of the stacked body.

Moreover, in the multi-layer piezoelectric element of the invention, it is preferable that a part of the surface of the external electrode which corresponds to one of the projections in the surface of the conductive connection member is one of the depressions.

Moreover, in the multi-layer piezoelectric element of the invention, it is preferable that one of the projections of the surface of the conductive connection member located in a midportion of the stacked body in the stacked direction thereof is higher than another one of the projections located in opposite end portions thereof.

Moreover, in the multi-layer piezoelectric element of the invention, it is preferable that a difference in level between the projections and depressions of the surface of the conductive connection member located in the midportion of the stacked body in the stacked direction thereof is larger than the difference located in end portions thereof.

Moreover, in the multi-layer piezoelectric element of the invention, it is preferable that the multi-layer piezoelectric element further comprises an external lead member, and a part of the external lead member is embedded in the projections of the surface of the conductive connection member.

Moreover, in the multi-layer piezoelectric element of the invention, it is preferable that the part of the external lead member embedded in the conductive connection member is configured to be able to follow extension and contraction of the stacked body.

Moreover, in the multi-layer piezoelectric element of the invention, it is preferable that the conductive connection member is formed of a conductive resin, the conductive resin being configured to disperse non-spherical conductive particles made of silver or an alloy composed predominantly of silver in a resin.

Moreover, in the multi-layer piezoelectric element of the invention, it is preferable that the resin is a resin having an imide bond.

The invention provides an injection device, comprising;
a container comprising an injection hole; and
the multi-layer piezoelectric element mentioned above, wherein
a fluid stored in the container is injected through the injection hole by driving of the multi-layer piezoelectric element.

The invention provides a fuel injection system, comprising:
a common rail configured to store high-pressure fuel;
the injection device mentioned above configured to inject the high-pressure fuel stored in the common rail;
a pressure pump configured to supply the high-pressure fuel to the common rail; and
an injection control unit configured to send a driving signal to the injection device.

Advantageous Effects of Invention

According to the invention, the multi-layer piezoelectric element comprises: the stacked body configured so that the piezoelectric layers and the internal electrode layers are alternately laminated; the external electrode bonded to the side surface of the stacked body and electrically connected to the internal electrode layers; and the conductive connection member attached to the surface of the external electrode, the surface of the conductive connection member comprising projections and depressions formed repeatedly at least in the stacked direction of the stacked body. Accordingly, the conductive connection member exhibits pliability against stress caused by extension and contraction of the stacked body in the stacked direction thereof (stress relaxation effect). Therefore, even if the multi-layer piezoelectric element is continuously driven at high speed, it is possible to suppress breaking of the external electrode and the conductive connection member and separation of them from the side surface of the stacked body.

Moreover, in the case where the multi-layer piezoelectric element is used in a compressed state under a load in advance, even if tensile and compressive stresses are applied repeatedly from the external lead member fixedly connected to the multi-layer piezoelectric element, by virtue of the stress relaxation effect afforded by providing the surface of the conductive connection member with projections and depressions formed repeatedly at least in the stacked direction of the stacked body, it is possible to suppress separation and breaking of the external lead member.

Moreover, even in the case of passing a large electric current through the external electrode and the conductive connection member to drive the multi-layer piezoelectric element at high speed, since the surface of the conductive connection member has projections and depressions, it follows that the surface area of the conductive connection member is increased with consequent enhancement in heat-dissipation characteristics. As a result, it is possible to suppress thermal breakdown of the external electrode and the conductive connection member induced by heat generation.

Moreover, in the case of applying a coating of an insulating resin to the surface of the conductive connection member, since the surface of the conductive connection member has projections and depressions, the strength of bonding of the insulating resin to the conductive connection member is increased by virtue of an anchor effect. As a result, even if the multi-layer piezoelectric element is continuously driven over and over again, it is possible to suppress separation of the insulating resin from the conductive connection member.

Moreover, in the multi-layer piezoelectric element of the invention, when the projections and depressions in the surface of the conductive connection member are arranged periodically in the stacked direction of the stacked body, it is possible to absorb stress caused by extension and contraction of the stacked body at even distribution in the stacked direction thereof.

Moreover, in the multi-layer piezoelectric element of the invention, when the surface of the external electrode comprises projections and depressions formed repeatedly in the stacked direction of the stacked body, the strength of bonding of the conductive connection member to the external electrode is increased by virtue of an anchor effect. As a result, even if the multi-layer piezoelectric element is continuously driven over and over again, it is possible to suppress separation of the conductive connection member from the external electrode.

Moreover, in the multi-layer piezoelectric element of the invention, when a part of the surface of the external electrode which corresponds to one of the projections in the surface of the conductive connection member is one of the depressions, it is possible to configure the conductive connection member so as to serve as spring. Therefore, especially in the case of using the multi-layer piezoelectric element in a compressed state under a load in advance, even if tensile and compressive stresses are applied repeatedly from the external lead member fixedly connected to the multi-layer piezoelectric element, by virtue of enhanced stress relaxation effect, it is possible to suppress separation and breaking of the external lead member.

Moreover, in the multi-layer piezoelectric element of the invention, when one of the projections of the surface of the conductive connection member located in the midportion of the stacked body in the stacked direction thereof is higher than another one of projections located in end portions thereof, the stress relaxation effect can be enhanced even further. That is, in the case of using the multi-layer piezoelectric element in a compressed state under a load in advance, the length of the outer periphery of the midportion of the stacked body becomes larger than the length of the outer periphery of the end portion of the stacked body during compression of the stacked body, and contrariwise becomes smaller than the length of the outer periphery of the end portion of the stacked body during extension of the stacked body, and thus the midportion of the stacked body exhibits the highest rate of deformation. Here, when one of the projections of the surface of the conductive connection member located in the midportion of the stacked body in the stacked direction thereof is higher than another one of projections located in end portions thereof, it is possible to provide higher stress relaxation effect in a specific region of the operated multi-layer piezoelectric element that is deformed most greatly. Accordingly, it is possible to further suppress breaking, separation and thermal breakdown of the external electrode and the conductive connection member, and separation of the external lead member.

By the same token, in the multi-layer piezoelectric element of the invention, when a difference in level between the projections and depressions of the surface of the conductive connection member located in the midportion of the stacked body in the stacked direction thereof is larger than the difference located in end portions thereof, it is possible to provide enhanced stress relaxation effect in the region of the operated multi-layer piezoelectric element that is deformed most greatly. Accordingly, it is possible to further suppress breaking, separation and thermal breakdown of the external electrode and the conductive connection member, and separation of the external lead member.

Moreover, in the multi-layer piezoelectric element of the invention, when the multi-layer piezoelectric element further comprises an external lead member, and the part of the external lead member is embedded in the projections of the surface of the conductive connection member, even if the multi-layer piezoelectric element is continuously driven for a long period of time under a high-speed and high-load condition with the passage of a large electric current and consequently a crack is developed in the depression of the conductive connection member, electrical breaking of the does not occur, and as a result, it is possible to suppress deterioration in displacement characteristics due to failure to supply voltage to a part of the piezoelectric layer.

Moreover, in the multi-layer piezoelectric element of the invention, when the part of the external lead member embedded in the conductive connection member is configured to be able to follow extension and contraction of the stacked body, it is possible to suppress deterioration in the displacement characteristics of the multi-layer piezoelectric element under the binding force of the external lead member and separation of the conductive connection member from the external electrode under the load placed on the conductive connection member.

Moreover, in the multi-layer piezoelectric element of the invention, when the conductive connection member is formed of a conductive resin, the conductive resin being configured to disperse non-spherical conductive particles made of silver or an alloy composed predominantly of silver in a resin, as compared with an electrode which contains a glass and is formed by firing, the conductive connection member becomes pliable. This makes it possible to enhance following capability responsive to extension and contraction of the stacked body even further, and thereby absorb stress effectively.

Moreover, by utilizing conductive particles having excellent oxidation resistance and low resistivity, which is made of silver or an alloy composed predominantly of silver, as the conductive material contained in the conductive resin, the conductive particles are free of oxidation even under a high temperature condition for use. This makes it possible to achieve low resistivity. As a result, it is possible to supply voltage to the stacked body with stability.

Moreover, by imparting a non-spherical shape, such as a scaly shape or needlelike shape, to the conductive particles, adjoining conductive particles make contact with each other not at one point, but at a plurality of points, or have line contact or surface contact with each other in an intertwined state, thereby significantly increasing the shear strength of the conductive connection member. As a result, even if the multi-layer piezoelectric element is continuously driven under a high electric field condition, it is possible to suppress development of a crack or the like in the conductive connection member.

Moreover, by imparting a non-spherical shape, such as a scaly shape or needlelike shape, to the conductive particles, the area of contact between adjoining conductive particles is increased, and it is possible to realize low resistivity of the conductive connection member. Accordingly, even if the multi-layer piezoelectric element is driven at high speed with the passage of a large electric current, since heat generation from the conductive connection member can be suppressed, it is possible to prevent heat-induced quality degradation and breaking of the conductive connection member.

Moreover, in the multi-layer piezoelectric element of the invention, when the resin used for the conductive connection member is a resin having an imide bond, even if the multi-layer piezoelectric element is continuously driven at high temperature, the conductive connection member is less prone to heat-induced quality degradation. This makes it possible to provide the multi-layer piezoelectric element that succeeds in exhibiting high reliability for a long period of time.

According to the invention, the injection device comprises: the container comprising an injection hole; and the multi-layer piezoelectric element of the invention, wherein a fluid stored in the container is injected through the injection hole by driving of the multi-layer piezoelectric element. Thus, it is possible to suppress separation of the conductive connection member from the external electrode formed on the side surface of the stacked body constituting the multi-layer piezoelectric element. Moreover, since this makes it possible to suppress thermal breakdown of the external electrode induced by heat generation, it is possible to effect desired liquid injection with stability for a long period of time.

According to the invention, the fuel injection system comprises: the common rail configured to store high-pressure fuel; the injection device of the invention configured to inject the high-pressure fuel stored in the common rail; the pressure pump configured to supply the high-pressure fuel to the common rail; and the injection control unit configured to send a driving signal to the injection device. With this construction, it is possible to effect desired injection of high-pressure fuel with stability for a long period of time.

DESCRIPTION OF EMBODIMENTS

Hereinafter, embodiments of a multi-layer piezoelectric element according to the invention will be described in detail with reference to the drawings.

Figure 1:
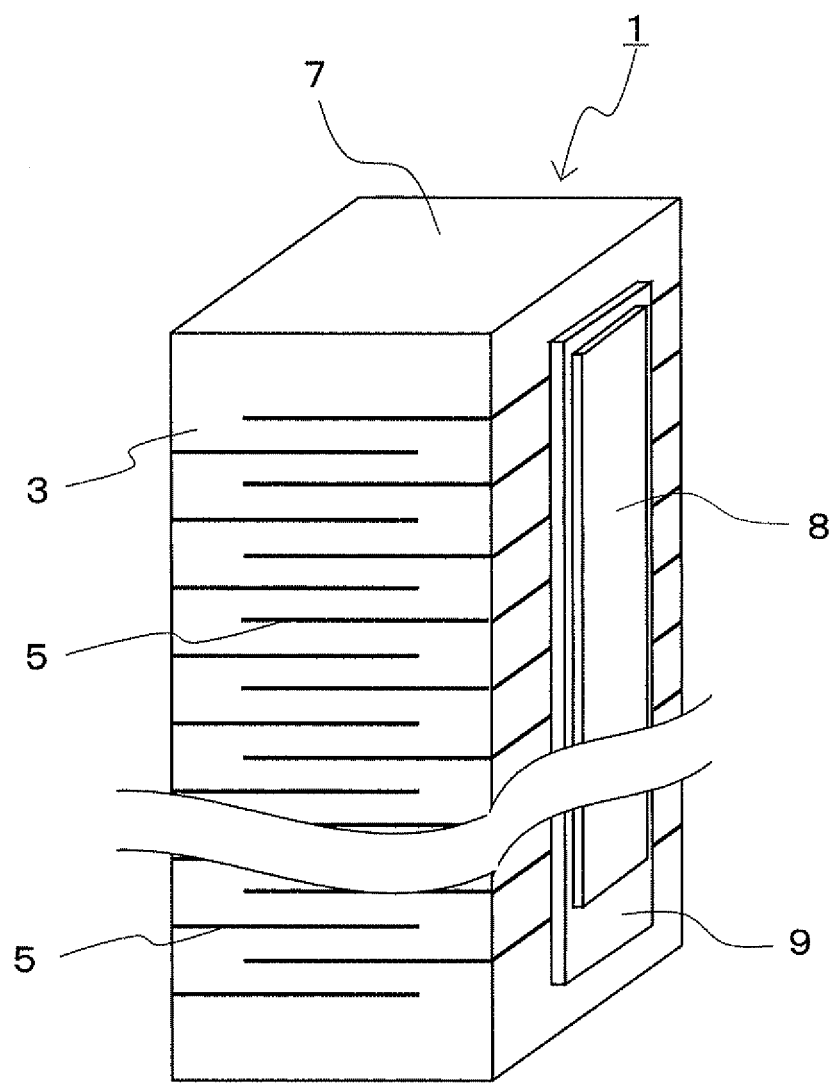
FIG. 1 is a perspective view showing an embodiment of a multi-layer piezoelectric element according to the invention.
Figure 2:
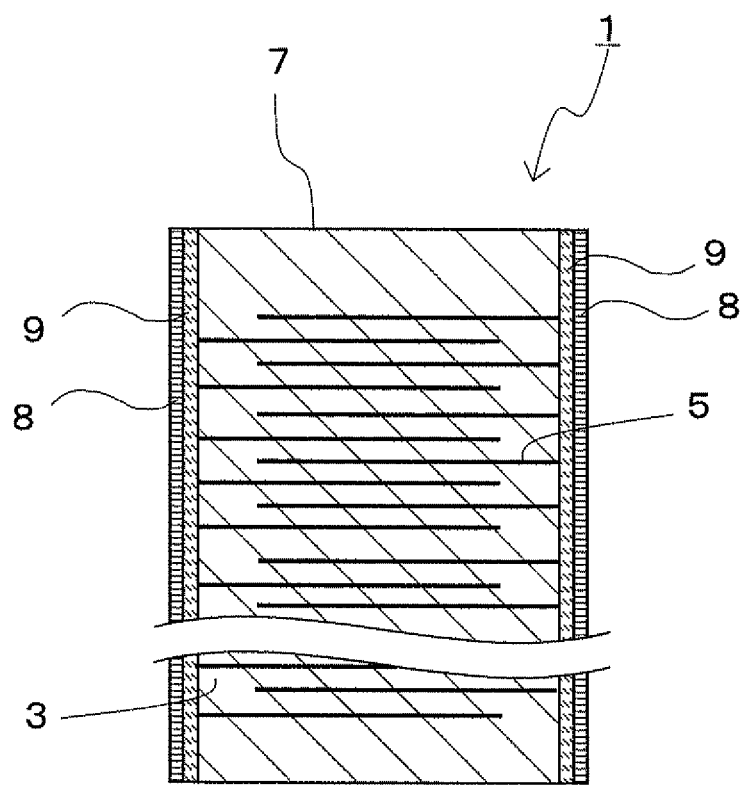
FIG. 2 is a sectional view of the multi-layer piezoelectric element shown in FIG. 1 taken on a plane parallel to a stacked direction thereof.
Figure 3:
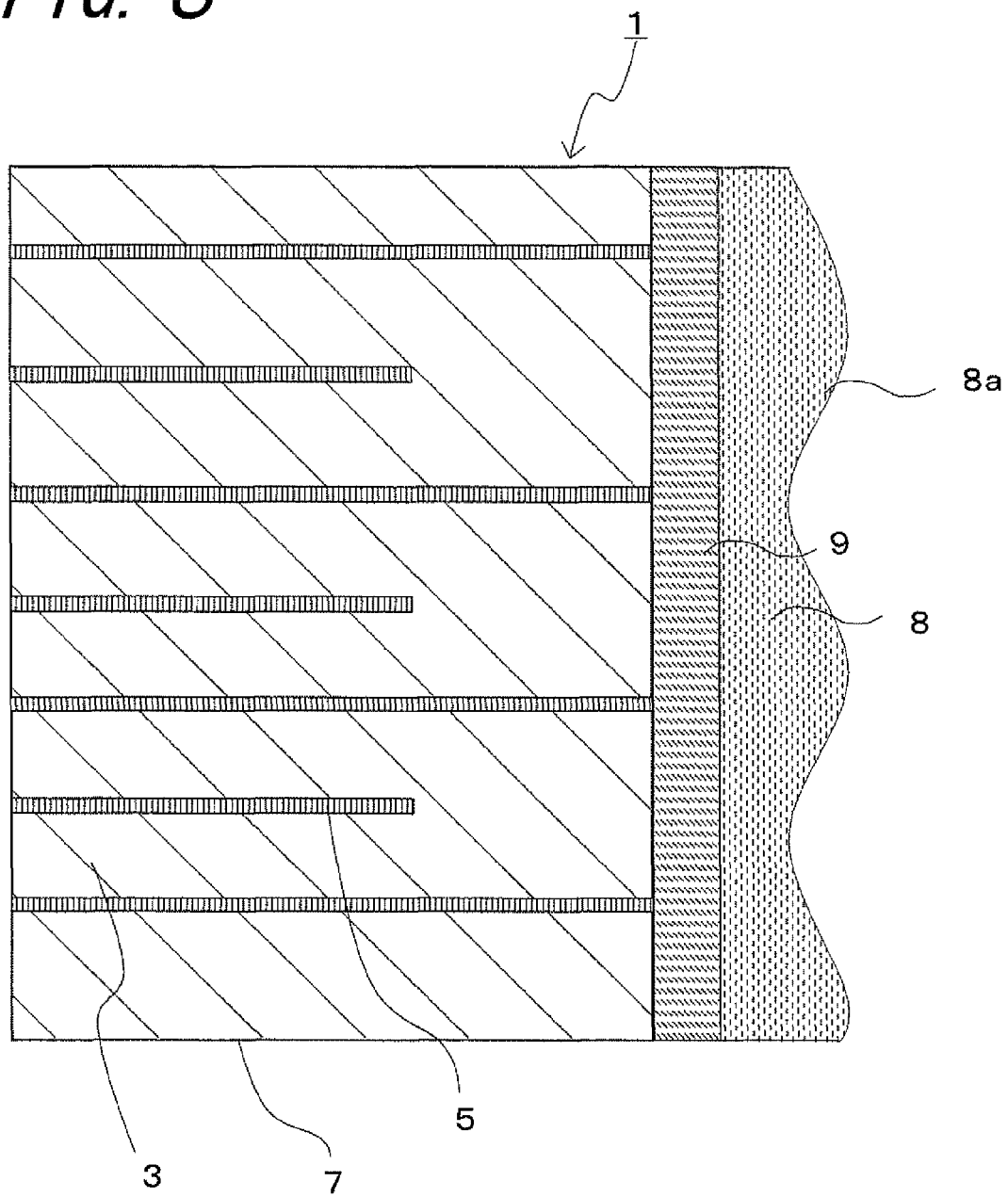
FIG. 3 is an enlarged sectional view of the multi-layer piezoelectric element shown in FIG. 2, illustrating an interface between a stacked body and an external electrode as well as a conductive connection member, and nearby regions.

FIG. 1 is a perspective view showing an embodiment of a multi-layer piezoelectric element according to the invention. FIG. 2 is a sectional view of the multi-layer piezoelectric element shown in FIG. 1 taken on a plane parallel to a stacked direction thereof. FIG. 3 is an enlarged sectional view of the multi-layer piezoelectric element shown in FIG. 2, illustrating the interface between a stacked body and an external electrode as well as a conductive connection member, and nearby regions.

As shown in FIG. 3, the multi-layer piezoelectric element 1 of this embodiment includes a stacked body 7 configured so that piezoelectric layers 3 and internal electrode layers 5 are alternately laminated; an external electrode 9 bonded to a side surface of the stacked body 7 and electrically connected to the internal electrode layers 5; and a conductive connection member 8 attached to a surface of the external electrode 9, a surface of the conductive connection member 8 comprising projections and depressions 8*a* formed repeatedly at least in a stacked direction of the stacked body 7.

In the above structure, the conductive connection member 8 exhibits pliability against stress caused by extension and contraction of the stacked body 7 in the stacked direction thereof. Therefore, even if the multi-layer piezoelectric element 1 is continuously driven at high speed, it is possible to suppress breaking of the external electrode 9 and the conductive connection member 8 and separation of them from the side surface of the stacked body 7.

Moreover, even in the case of passing a large electric current through the external electrode 9 and the conductive connection member 8 to drive the multi-layer piezoelectric element 1 at high speed, since the surface of the conductive connection member 8 has the projections and depressions 8*a*, it follows that the surface area of the conductive connection member 8 is increased with consequent enhancement in heat-dissipation characteristics. As a result, it is possible to suppress thermal breakdown of the external electrode 9 and the conductive connection member 8 induced by heat generation.

Further, in the case of applying a coating of an insulating resin to the surface of the conductive connection member 8, since the surface of the conductive connection member 8 has the projections and depressions 8*a*, the strength of bonding of the insulating resin to the conductive connection member 8 is increased by virtue of an anchor effect. As a result, even if the multi-layer piezoelectric element 1 is continuously driven over and over again, it is possible to suppress separation of the insulating resin from the conductive connection member 8.

For example, the projections and depressions 8*a* formed on the surface of the conductive connection member 8 are each defined by a curve when viewed in cross section. In the interest of effective stress relaxation, with respect to a line of the average of the projections and depressions 8*a* (an imaginary line drawn so as to render the sum total of the areas of the projections equal to the sum total of the areas of the depressions in the vertical cross section), the projection has a height within the range of about 5 µm to 200 µm, and preferably at from about 10 µm to 50 µm. Likewise, the depression has a depth within the range of about 5 µm to 200 µm, and preferably at from about 10 µm to 50 µm. By adjusting the height of the projection and the depth of the depression within the above ranges, it is possible to achieve effective relaxation of stress caused by extension and contraction of the stacked body 7 in the stacked direction thereof. Therefore, it is possible to suppress occurrence of problems such as development of a crack in the conductive connection member 8 that may result in breaking or separation of the conductive connection member 8 from the external electrode 9.

Moreover, it is preferable that the projections and depressions 8*a* are arranged periodically in the stacked direction of the stacked body 7. This is because, by forming the projections and depressions 8*a* periodically in the stacked direction of the stacked body 7, it is possible to absorb stress caused by extension and contraction of the stacked body 7 at even distribution in the stacked direction thereof. In this case, in the interest of effective relaxation of stress caused by extension and contraction of the stacked body 7, the periodic interval (cycle) of the projections and depressions 8*a* arranged in the stacked direction is set to be about 0.8 to 20 times, and preferably about 2 to 8 times as great as the thickness of the piezoelectric layer 3.

The conductive connection member 8, which bears the projections and depressions 8*a* arranged periodically in the stacked direction of the stacked body 7, is made of a resin containing a dispersed conductive material, solder, or the like. For example, the conductive connection member 8 can be obtained by printing a resin-containing conductive paste flatly by means of screen printing, pattern-printing another resin-containing conductive paste thereon only in portions corresponding to the projections after drying treatment, and thereafter performing drying treatment and baking treatment.

Moreover, while it is advisable that the projections and depressions 8*a* are arranged at uniform periodic interval (cycle) in the stacked direction, the periodic interval may be varied in the stacked direction. In the case where that the periodic interval (cycle) of the projections and depressions 8*a* in the stacked direction is so varied as to decrease gradually with increasing proximity to a midportion in the stacked direction, the density of the periodic arrangement of the projections and depressions 8*a* increases gradually with increasing proximity to the midportion in the stacked direction that generates heat most, and heat-dissipation characteristic of the conductive connection member 8 becomes better gradually with increasing proximity to the midportion in the stacked direction correspondingly. As a result, there is an effect that thermal breakdown in the midportion of the stacked body 7 in the stacked direction that generates heat most is hard to occur, and this is preferable. Note that "midportion" refers to, out of three portions obtained by equal division of the stacked body in the stacked direction thereof, the central portion. For example, it is preferable that the periodic interval is so varied as to be gradually reduced to half with increasing proximity to the midportion in the stacked direction.

Figure 4:
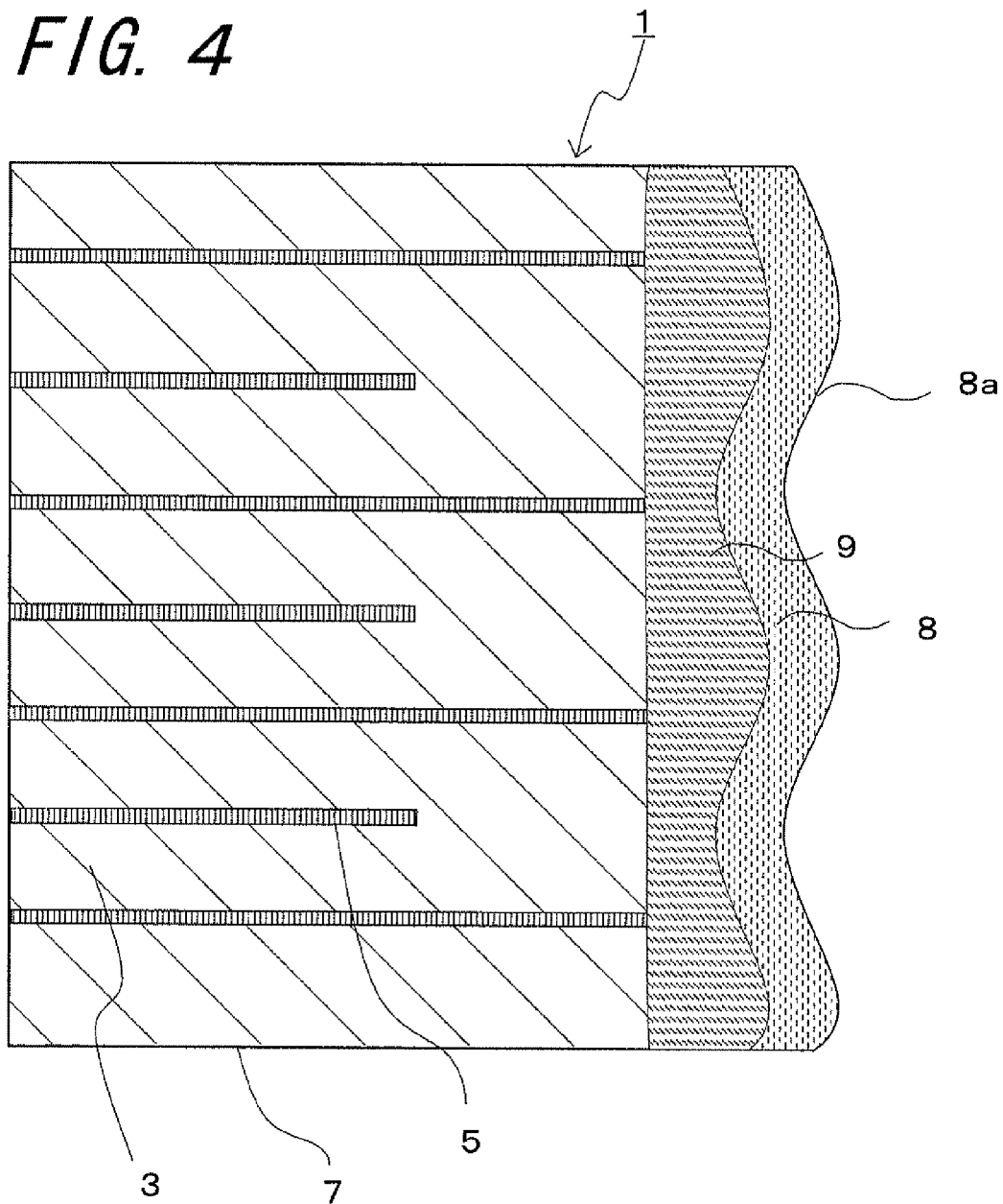
FIG. 4 is a sectional view showing another embodiment of a multi-layer piezoelectric element according to the invention taken on a plane parallel to a stacked direction thereof.

Also, as shown in FIG. 4, in the case where the surface of the external electrode 9 comprises projections and depressions formed repeatedly in the stacked direction of the stacked body 7, the strength of bonding of the conductive connection member 8 to the external electrode 9 is increased by virtue of an anchor effect. As a result, even if the multi-layer piezoelectric element 1 is continuously driven over and over again, it is possible to further suppress separation of the conductive connection member 8 from the external electrode.

Moreover, in the case where the multi-layer piezoelectric element 1 is used in a compressed state under a load in advance, even if tensile and compressive stresses are applied repeatedly from an external lead member 10 fixedly connected to the multi-layer piezoelectric element 1, by virtue of enhanced stress relaxation effect, it is possible to suppress separation and breaking of the external lead member 10.

Figure 5:
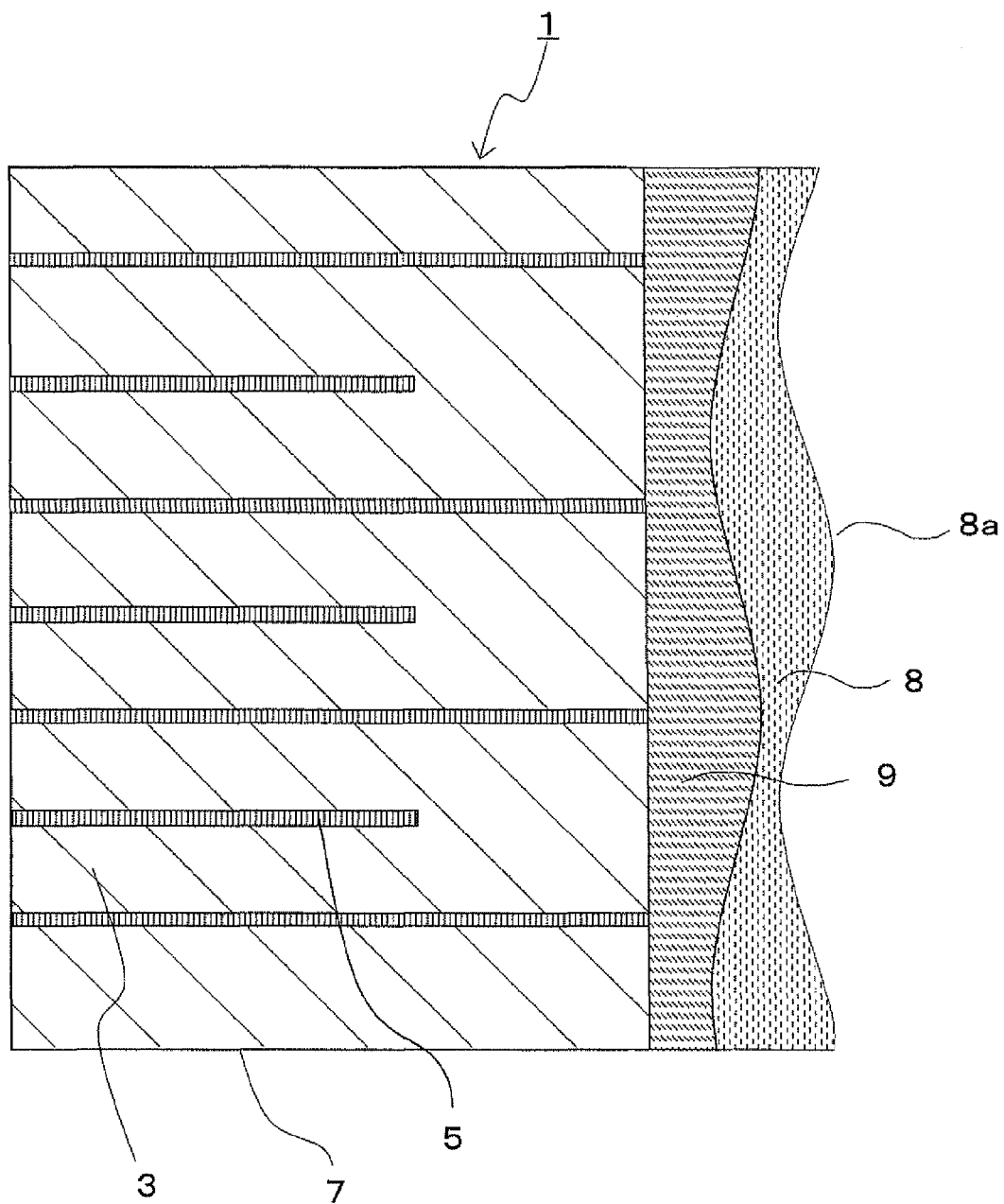
FIG. 5 is a sectional view showing another embodiment of a multi-layer piezoelectric element according to the invention taken on a plane parallel to a stacked direction thereof.

Moreover, as shown in FIG. 5, in the case where a part of the surface of the external electrode 9 which corresponds to one of the projections in the surface projection of the conductive connection member 8 is one of the depressions, the conductive connection member 8 is so configured as to serve as spring. Therefore, especially in the case of using the multi-layer piezoelectric element 1 in a compressed state under a load in advance, even if tensile and compressive stresses are applied repeatedly from the external lead member 10 fixedly connected to the multi-layer piezoelectric element 1, by virtue of enhanced stress relaxation effect, it is possible to suppress separation and breaking of the external lead member 10.

Moreover, while it is advisable that, in the projections and depressions 8a, the projections are uniform in height and the depressions are uniform in depth, the height and depth may be varied in the stacked direction. In the case where the projection height and the depression depth of the projections and depressions 8a is so varied as to increase gradually with increasing proximity to the midportion in the stacked direction, the heat-dissipation characteristic of the conductive connection member 8 becomes better gradually with increasing proximity to the midportion in the stacked direction correspondingly. This makes it possible to attain an effect that thermal breakdown in the midportion of the stacked body 7 in the stacked direction that generates heat most is hard to occur.

Moreover, in the case of using the multi-layer piezoelectric element 1 in a compressed state under a load in advance, the length of the outer periphery of the midportion of the stacked body 7 becomes larger than the length of the outer periphery of the end portion of the stacked body 7 during compression of the stacked body 7, and contrariwise becomes smaller than the length of the outer periphery of the end portion of the stacked body 7 during extension of the stacked body 7, and thus the midportion of the stacked body 7 exhibits the highest rate of deformation. Here, when one of the projections of the surface of the conductive connection member 8 located in the midportion of the stacked body 7 in the stacked direction thereof is higher than another one of the projections located in end portions thereof, it is possible to provide the highest anchor effect in a specific region of the operated multi-layer piezoelectric element 1 that is deformed most greatly, and this is preferable. Note that, while it is advisable to increase the height of the projection located in the midportion in accordance with the rate of deformation of the piezoelectric layer 3, preferably, the height of the projection located in the midportion of the stacked body in the stacked direction thereof is about twice as large as the height of the projection located in end portions thereof.

By the same token, when a difference in level between the projections and depressions of the surface of the conductive connection member 8 located in the midportion of the stacked body 7 in the stacked direction thereof is larger than the difference located in end portions thereof, it is possible to enhance the stress relaxation effect in the region of the operated multi-layer piezoelectric element 1 that is deformed most greatly. Note that, while it is advisable to increase the difference in level between the surface projections and depressions located in the midportion in accordance with the rate of deformation of the piezoelectric layer 3, preferably, the difference in level between the surface projections and depressions located in the midportion is about twice as large as the difference in level between those located in end portions.

It is preferable that the top of the surface projection of the conductive connection member 8 is arcuately shaped. In this case, when the multi-layer piezoelectric element 1 is deformed during driving, the curvature of the arcuate part changes, thereby enhancing the stress relaxation effect. Moreover, by configuring the conductive connection member 8 so that the curvature at the top of the surface projection located in the midportion of the stacked body 7 in the stacked direction thereof is smaller than the curvature at the top of the surface projection located in end portions thereof, and preferably, by adjusting the curvature at the top of the surface projection located in the midportion to one-half of that of the surface projection located in each of the opposite end portions, it is possible to reduce the rate of deformation of surface shape in the region of the operated multi-layer piezoelectric element 1 that is deformed most greatly. Accordingly, it is possible to provide enhanced stress relaxation effect in the region of the operated multi-layer piezoelectric element 1 that is deformed most greatly, wherefore it is possible to further suppress breaking, separation and thermal breakdown of the external electrode 9 and the conductive connection member 8, and separation of the external lead member 10.

Figure 6:
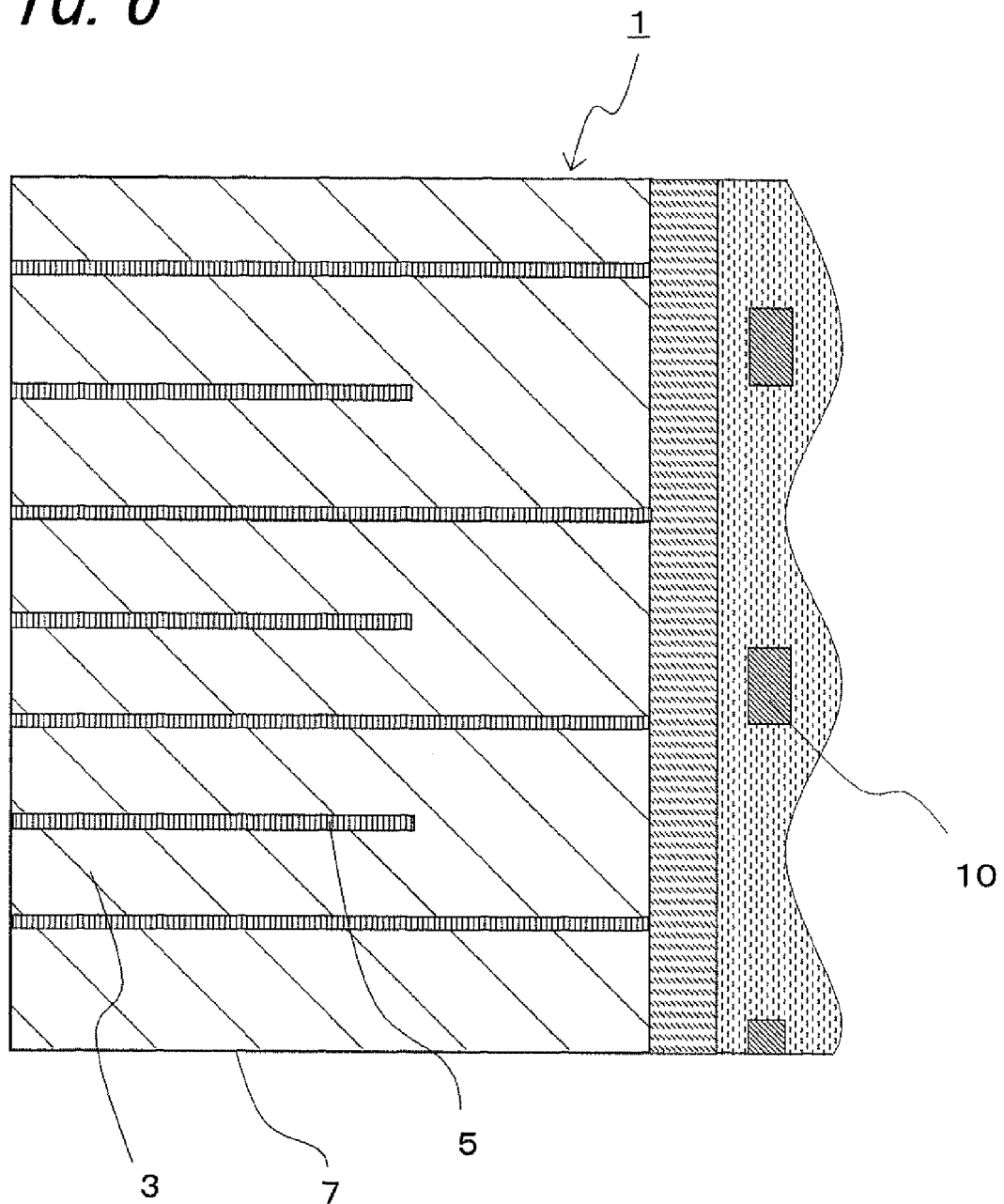
FIG. 6 is an enlarged sectional view showing a state where an external lead member is embedded in projections of a surface of the conductive connection member shown in FIG. 3.

Moreover, as shown in FIG. 6, it is preferable that a part of the external lead member 10 is embedded in the projections of the surface of the conductive connection member 8. According to this structure, even if the multi-layer piezoelectric element 1 is continuously driven for a long period of time under a high-speed and high-load condition with the passage of a large electric current and consequently a crack is developed in the depression of the conductive connection member 8, electrical breaking of the external electrode 8 does not occur. As a result, it is possible to suppress deterioration in displacement characteristics due to failure to supply voltage to a part of the piezoelectric layer 3.

While it is advisable that a part of the aforestated external lead member 10 is embedded in a part of the projections of the conductive connection member 8, and more preferably, a part of the external lead member 10 is embedded in almost the entire projections of the conductive connection member 8.

Moreover, in the interest of effecting supply of electric power to the external electrode 9 even though a crack is developed in the depression, it is preferable that the external lead members 10 with parts embedded in the projecting regions (projections) of the undulations (projections and depressions 8a) are electrically and mechanically connected to each other by means of a common electrode (bus bar electrode) or the like, for commonality, in locations other then the regions formed with the depressions. The commonality can be achieved not only by the common electrode (bus bar electrode), but by any given means that allows connection of the external lead members 10 in the locations other then the regions formed with the depressions.

It is preferable that a volume ratio of the external lead member 10 embedded in the conductive connection member 8 to the conductive connection member 8, based on the conductive connection member of 100% by volume, falls in the range from 2% by volume to 30% by volume. Where the ratio falls within the prescribed range, it is possible to effectively suppress occurrence of electrical breaking of the external electrode 8, as well as to suppress deterioration in following capability of the conductive connection member 8 responsive to extension and contraction of the stacked body 7 caused by an excessive volume ratio of the external lead member 10.

Such a configuration that a part of the external lead member 10 is embedded in the projections of the surface of the conductive connection member 8 is obtained by, firstly, for example, printing a resin adhesive-containing conductive paste evenly on the surface of the external electrode 9 by means of screen printing or the like, thereafter placing the external lead member 10 in a predetermined region, and then pattern-printing another resin adhesive-containing conductive paste on the surface in a portion corresponding to the external lead member 10.

Figure 7:
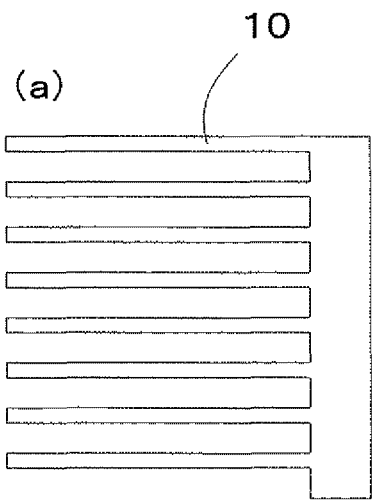
FIGS. 7(*a*) to 7(*d*) are plan views showing various shapes of the external lead member of the multi-layer piezoelectric element according to the invention.
Figure 7:
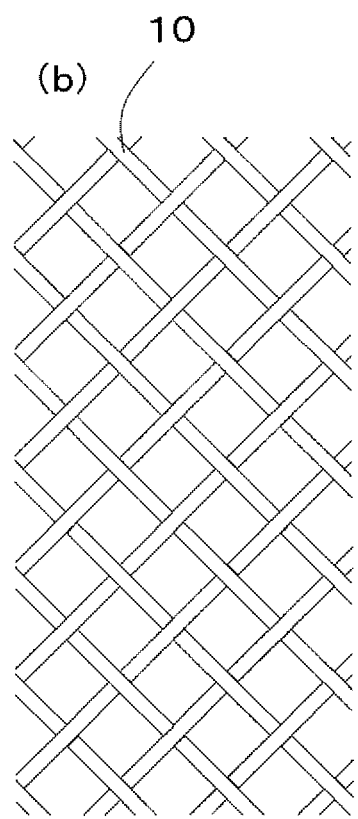
Figure 7:
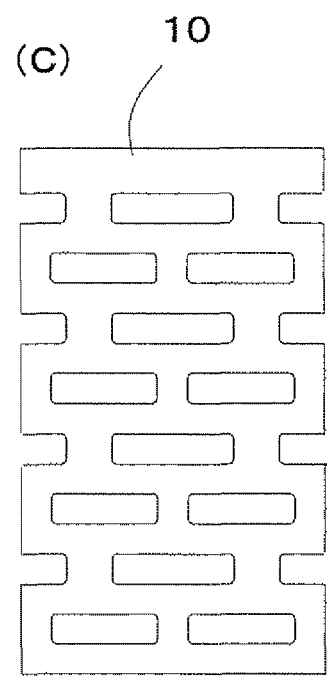
Figure 7:
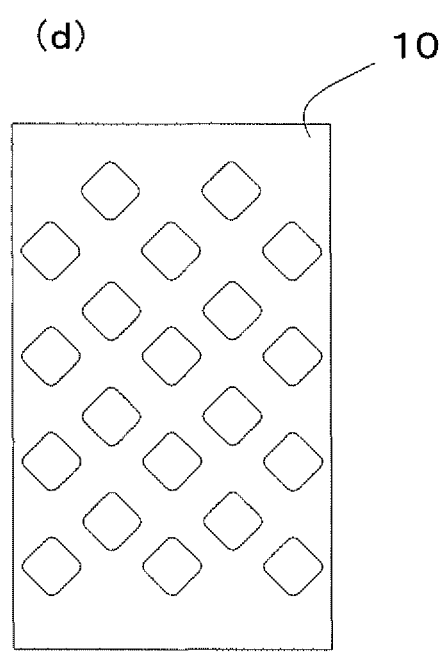

Moreover, as shown in FIG. 7, the external lead member 10 may take on various forms. FIG. 7(a) shows an external lead member formed of parallel arrangement of metal wire rods; FIG. 7(b) shows an external lead member made of woven metal mesh; and FIGS. 7(c) and 7(d) each show an external lead member formed by punching out parts of a metal plate by a punching technique utilizing an etching method or a punching die. These members exhibit a low elasticity in the direction of extension and contraction of the stacked body 7, but are elastically deformable in the direction of extension and contraction of the stacked body 7.

That is, the use of the external lead member 10 having such a form as shown in FIG. 7 makes it possible to follow extension and contraction of the stacked body 7, and as a result, it is possible to suppress deterioration in the displacement characteristics of the multi-layer piezoelectric element 1 under the binding force of the external lead member 10 and separation of the conductive connection member 8 from the external electrode 9 under the load placed on the conductive connection member 8.

It is noted that the external lead member 10 is not limited in form to those as shown in FIG. 7, but may be of any given form, for example, a void-bearing form, so long as elasticity decreases in the direction of extension and contraction of the stacked body 7.

Moreover, it is preferable that the conductive connection member 8 is formed of a conductive resin, the conductive resin being configured to disperse non-spherical conductive particles made of silver or an alloy composed predominantly of silver in a resin. In this case, as compared with an electrode which contains a glass and is formed by firing, the conductive connection member 8 becomes pliable, wherefore it is possible to enhance following capability responsive to extension and contraction of the stacked body 7 even further, and thereby absorb stress effectively.

Moreover, by utilizing conductive particles having excellent oxidation resistance and low resistivity, which is made of silver or an alloy composed predominantly of silver, as the conductive material contained in the conductive resin, the conductive particles are free of oxidation even under a high temperature condition for use. This makes it possible to achieve low resistivity. As a result, it is possible to supply voltage to the stacked body 7 with stability.

Moreover, in the case of imparting a non-spherical shape, such as a scaly shape or needlelike shape, to the conductive particles, the adjoining conductive particles make contact with each other not at one point, but at a plurality of points, or have line contact or surface contact with each other in an intertwined state, thereby significantly increasing the shear strength of the conductive connection member 8. As a result, even if the multi-layer piezoelectric element 1 is continuously driven under a high electric field condition, it is possible to suppress development of a crack or the like in the conductive connection member 8.

Further, in the case of imparting a non-spherical shape, such as a scaly shape or needlelike shape, to the conductive particles, the area of contact between the adjoining conductive particles is increased, and it is possible to realize low resistivity of the conductive connection member 8. Accordingly, even if the multi-layer piezoelectric element 1 is driven at high speed with the passage of a large electric current, since heat generation from the conductive connection member 8 can be suppressed, it is possible to prevent heat-induced quality degradation and breaking of the conductive connection member 8.

With respect to silver or an alloy composed predominantly of silver constituting the conductive particles, when the conductive particles are made of silver, the silver should be sterling silver or silver containing impurities, etc. On the other hand, when the conductive particles are made of an alloy composed predominantly of silver, the alloy should be a Ag—Pd alloy, a Ag—Pt alloy, a Ag—Cu alloy, or the like.

It is noted that "alloy composed predominantly of silver" refers to an alloy in which the content of silver exceeds 50% by mass and an alloy in which silver content is maximum.

It is preferable that the conductive particles have an average particle size of the range of 0.1 μm to 20 μm. When the average particle size falls within the prescribed range, it is possible to realize low resistivity of the conductive connection member 8, as well as to increase the shear strength of the conductive connection member 8. Note that the average particle size is determined by measurement using a metallographic microscope or scanning electromicroscope (SEM). When the conductive particles have a non-spherical shape, for example, the size of a single conductive particle is defined as the mean value of the maximum diameter and the minimum diameter, and the average particle size can be determined by calculation on the basis of the mean value.

It is preferable that the amount of the conductive particles contained in the conductive connection member 8 falls in the range of 85% by mass to 98% by mass. When the content falls within the prescribed range, it is possible to realize sufficiently low resistivity of the conductive connection member 8, as well as to suppress deterioration in following capability of the conductive connection member 8 made of a conductive resin responsive to extension and contraction of the stacked body 7.

Moreover, in the conductive connection member 8, both non-spherical conductive particles and spherical conductive particles smaller in size than the non-spherical conductive particles may be contained. In this case, the smaller-sized conductive particles find their ways into the gap between adjoining non-spherical conductive particles. This makes it possible to increase the amount of conductive particles having electrical conductivity, and thereby realize even lower resistivity of the conductive connection member 8.

Moreover, when the conductive connection member 8 is made of a conductive resin, it is preferable that the resin is a resin having an imide bond, such as polyimide or polyamide imide. In this way, by using a highly heat-resistant resin having an imide bond such as polyimide or polyamide imide as the resin constituting the conductive connection member 8, even if the multi-layer piezoelectric element 1 is continuously driven at high temperature, the conductive connection member 8 is less prone to heat-induced quality degradation. As a result, it is possible to provide the multi-layer piezoelectric element 1 that succeeds in exhibiting high reliability for a long period of time.

Next, a method of manufacturing the multi-layer piezoelectric element 1 of this embodiment will be described.

At first, ceramic green sheets which turn to the piezoelectric layers 3 are prepared. To be specific, calcined piezoelectric ceramic powder, a binder made of an organic high polymer such as acrylic polymer or butyral polymer, and a plasticizer are mixed to prepare a slurry ceramic green sheets are prepared from the slurry by a tape forming technique such as the doctor blade method or the calender roll method. The piezoelectric ceramic may be of any given type so long as it has piezoelectric property. For example, perovskite-type oxide formed of $PbZrO_3$—$PbTiO_3$ can be used. Moreover, as the plasticizer, dibutyl phthalate (DBP), dioctyl phthalate (DOP), or the like can be used.

Next, a conductive paste which turns to the internal electrode layer 5 is prepared. To be specific, the conductive paste can be prepared by admixing a binder and a plasticizer in silver-palladium metal powder. The conductive paste is placed onto the aforestated ceramic green sheet in a pattern of the internal electrode layer 5 by means of screen printing. Then, a plurality of ceramic green sheets with the conductive paste printed thereon are stacked on top of each other. The resultant body is subjected to debinding, or binder removal treatment at a predetermined temperature, and is whereafter fired at a temperature of 900 to 1200° C. In this way, there is obtained the stacked body 7 composed of a laminate of alternate piezoelectric layers 3 and internal electrode layers 5.

It is noted that the stacked body 7 can be formed not only by the above manufacturing technique, but by any given technique that allows formation of the stacked body 7 configured so that a plurality of piezoelectric layers 3 and a plurality of internal electrode layers 5 are alternately laminated.

Next, the stacked body 7 obtained through firing is ground into a predetermined shape by means of a surface grinder or the like.

After that, a silver-glass containing conductive paste, which is prepared by adding a binder, a plasticizer, and a solvent to glass powder and conductive particles composed predominantly of silver, is printed onto the side surface of the stacked body 7 in a pattern of the external electrode 9 by means of screen printing or the like. Subsequently, drying treatment is performed thereon at a predetermined temperature, followed by baking treatment. In this way, it is possible to form the external electrode 9.

Next, on the surface of the external electrode 9, a resin adhesive-containing conductive paste, which turns to the conductive connection member 8 after baking and curing treatment, is printed by means of screen printing or the like so that its surface can have projections and depressions formed repeatedly in the stacked direction, followed by curing treatment. In this way, it is possible to obtain the conductive connection member 8 whose surface has projections and depressions formed repeatedly in the stacked direction. That is, as an example of techniques to form projections and depressions in the surface of the conductive connection member 8, there is a method comprising printing a resin adhesive-containing conductive paste flatly by means of screen printing, pattern-printing a resin-containing conductive paste on the flat surface only in portions corresponding to the projections after drying treatment, and performing drying treatment and baking treatment.

It is noted that the use of a resin adhesive-containing conductive paste having excellent leveling property makes it possible to form the conductive connection member 8 whose surface has gently curved projections and depressions. By way of contrast, the use of a resin adhesive-containing conductive paste having poor leveling property makes it possible to form the conductive connection member 8 whose surface has projections and depressions with sharp level difference. The leveling property can be controlled by making adjustment to the amount of solvent contained in the conductive paste.

Moreover, in order to embed a part of the external lead member 10 in the projections of the conductive connection member 8, it is advisable to adopt a method comprising printing a resin adhesive-containing conductive paste evenly on the surface of the external electrode 9 by means of screen printing or the like, placing the external lead member 10 in a predetermined region, and pattern-printing another resin adhesive-containing conductive paste on the surface in a portion corresponding to the external lead member 10. In this way, it is possible to produce the multi-layer piezoelectric element 1 in which the conductive connection member 8 whose surface has projections and depressions is formed and a part of the external lead member 10 is embedded in a part of the conductive connection member 8 which corresponds to one of the projections.

It is noted that the external lead member 10 may take a form of metal wire rods arranged substantially parallely in a direction perpendicular to the stacked direction, a form of woven metal mesh, or a form of a metal plate with parts punched out by a punching technique utilizing an etching method or a punching die. Any of these forms is made extensible and contractible in the stacked direction.

In the case of adopting the woven metal-mesh form, either plain weave design or twilled weave design can be used. Moreover, in the interest of providing pliability in the stacked direction, the angle which a metal wire rod constituting the mesh forms with the stacked direction is preferably 10 degrees or above, and more preferably falls in the range of 30 degrees to 60 degrees.

Moreover, as a material of the external lead member 10, a metal or an alloy such as silver, nickel, copper, phosphor bronze, iron, and stainless steel is preferable. Further, the surface of the external lead member 10 may be coated with a plating film of silver, nickel, or the like.

Next, the stacked body 7 formed with the external electrode 9 and the conductive connection member 8 is immersed in a resin solution containing silicone resin as an outer cladding resin. The resin solution is then subjected to vacuum degassing treatment to cause the silicone resin to adhere tightly to the outer side surface of the stacked body 7. Subsequently, the stacked body 7 is pulled out of the resin solution, whereupon a coating of silicone resin is applied to the side surface of the stacked body 7 formed with the external electrode 9 and the conductive connection member 8.

After that, a direct-current voltage of 0.1 to 3 kV/mm is applied to the conductive connection members 8 connected to a pair of the external electrodes 9 to polarize the piezoelectric body constituting the stacked body 7. In this way, the construction of the multi-layer piezoelectric element 1 of this embodiment is completed. According to the multi-layer piezoelectric element 1, the external electrode 9 is connected to an external power source through the lead that is the conductive connection member 8, so that a voltage is applied to the piezoelectric layer 3. This allows each of the piezoelectric layers 3 to undergo significant displacement under an inverse piezoelectric effect. Thus, the multi-layer piezoelectric element is capable of functioning as, for example, an automotive fuel injection valve configured to feed fuel into an engine by injection.

Figure 8:
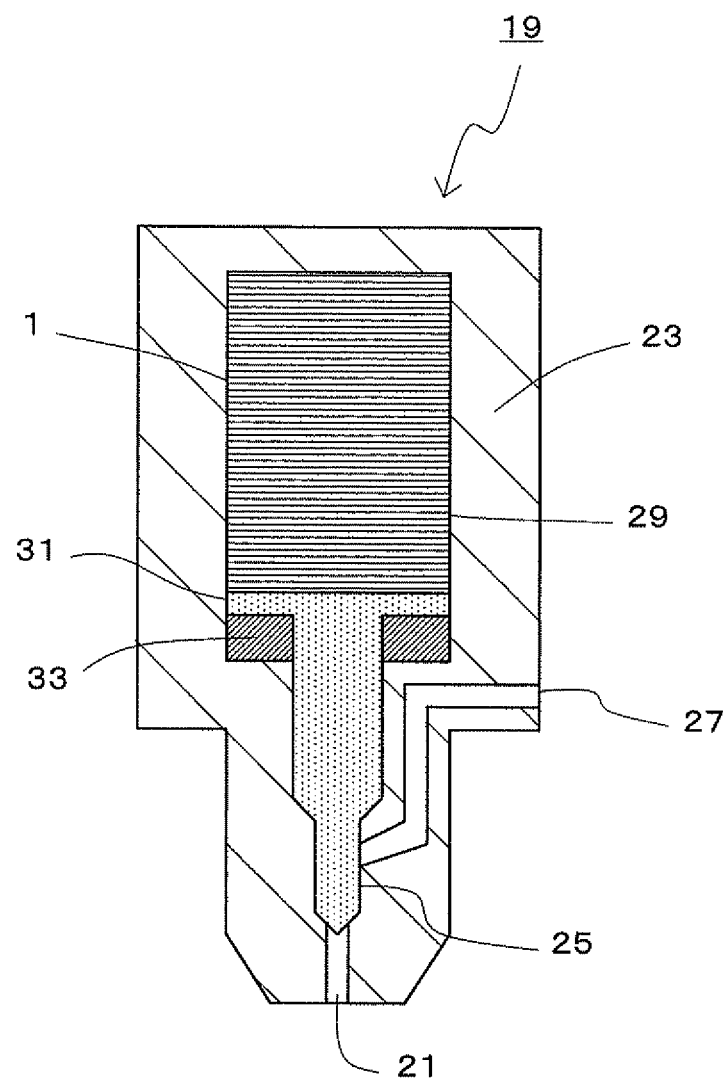
FIG. 8 is a schematic sectional view showing an embodiment of an injection device according to the invention.

Next, an embodiment of an injection device according to the invention will be described. FIG. 8 is a schematic sectional view showing an embodiment of the injection device according to the invention.

As shown in FIG. 8, the injection device 19 according to this embodiment comprises a housing (container) 23 comprising an injection hole 21 at one end thereof, and the foregoing multi-layer piezoelectric element 1 according to the embodiment placed within the housing 23.

In an interior of the housing 23 is disposed a needle valve 25 capable of opening and closing of the injection hole 21. A fluid passage 27 is so disposed as to be capable of communicating with the injection hole 21 in accordance with the movement of the needle valve 25. The fluid passage 27 is coupled to an external fluid supply source, so that a fluid is supplied to the fluid passage 27 under high pressure at all times. Therefore, when the needle valve 25 is operated to open the injection hole 21, then a fluid which has been fed through the fluid passage 27 is injected, through the injection hole 21, to an exterior of the device or into an adjacent container, for example, a fuel chamber of an internal-combustion engine (not shown).

Moreover, an upper end of the needle valve 25 is formed to have an internal diameter large enough for the placement of a cylinder 29 and a slidable piston 31 formed in the housing 23. In addition, the foregoing multi-layer piezoelectric element 1 according to the embodiment is placed within the housing 23.

In the injection device 19 thereby constructed, upon extension of the multi-layer piezoelectric element 1 entailed by application of voltage, the piston 31 is pushed forward, thus causing the needle valve 25 to close the fluid passage 27 communicating with the injection hole 21 with a consequent halt on supply of fluid. Moreover, upon stopping the application of voltage, the multi-layer piezoelectric element 1 is contracted, and a disc spring 33 pushes the piston 31 backward, thereby opening the fluid passage 27. In consequence, the injection hole 21 communicates with the fluid passage 27 so that injection of fluid can be carried out through the injection hole 21.

It is noted that the injection device may be so designed that the fluid passage 27 is opened by applying a voltage to the multi-layer piezoelectric element 1, and is contrariwise closed upon a halt on the application of voltage.

Moreover, the injection device according to the embodiment may comprise a housing comprising an injection hole and the multi-layer piezoelectric element 1 according to the embodiment, wherein a fluid stored in the housing is injected through the injection hole by driving of the multi-layer piezoelectric element 1. That is, the multi-layer piezoelectric element 1 does not necessarily have to be placed within the housing 23. It is essential only that a pressure for control of fluid injection is applied to the interior of the housing by driving of the multi-layer piezoelectric element 1. In this embodiment, the term "fluid" is construed as encompassing not only fuel and ink, but also various liquid fluid (such as a conductive paste) and gases. The use of the injection device 19 according to the embodiment makes it possible to control a flow rate of fluid and timing of fluid injection with stability for a long period of time.

When the injection device 19 according to the embodiment using the multi-layer piezoelectric element 1 according to the embodiment is used for an internal-combustion engine, fuel can be injected toward a combustion chamber of the internal-combustion engine such as an engine with higher accuracy for a longer period of time compared to the case of using a conventional injection device.

Figure 9:
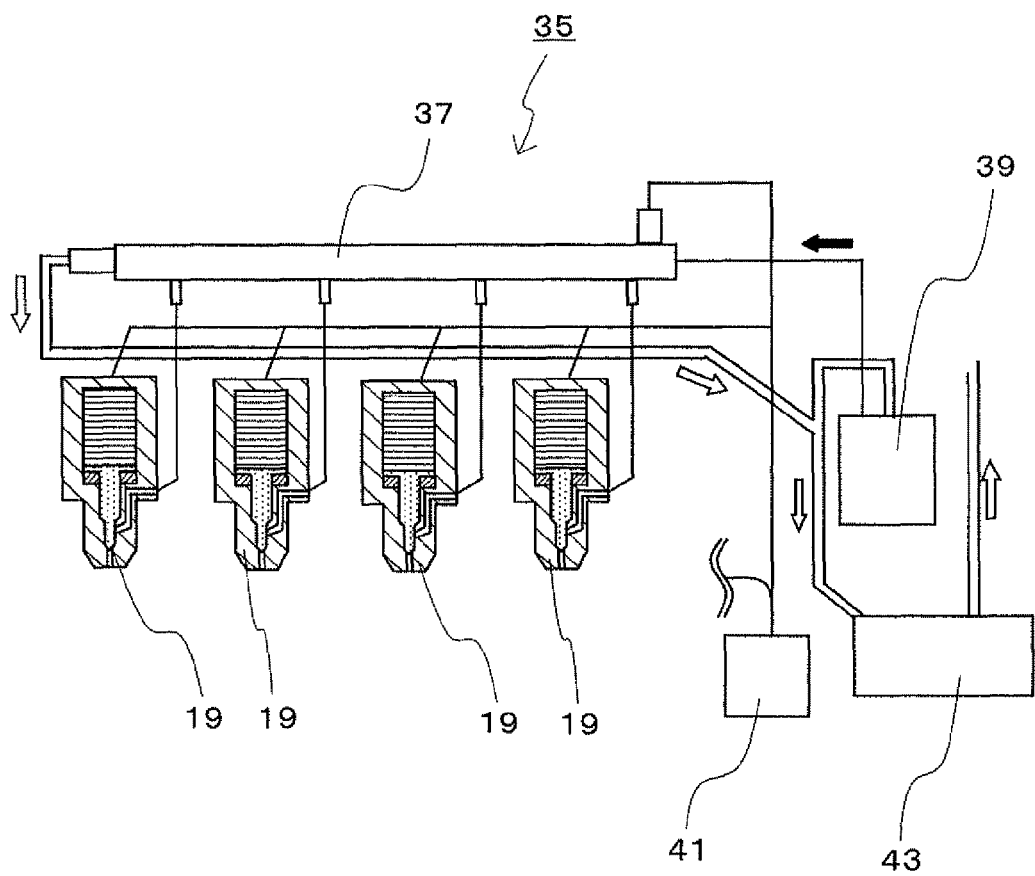
FIG. 9 is a schematic block diagram showing an embodiment of a fuel injection system according to the invention.

Next, an embodiment of a fuel injection system according to the invention will be described. FIG. 9 is a schematic diagram showing an embodiment of the fuel injection system according to the invention.

As shown in FIG. 9, the fuel injection system 35 according to the embodiment comprises a common rail 37 configured to store high-pressure fuel as high-pressure fluid, a plurality of the injection devices 19 according to the embodiment configured to inject the high-pressure fluid stored in the common rail 37, a pressure pump 39 configured to supply the high-pressure fluid to the common rail 37, and an injection control unit 41 configured to send a driving signal to the injection devices 19.

The injection control unit 41 controls an amount of injection of the high-pressure fluid and timing of fluid injection on the basis of external information or external signals. For example, in the case of using the injection control unit 41 for injection of fuel into an engine, it is possible to control the amount of fuel injection and the timing of fuel injection while detecting the condition of the interior of the combustion chamber of the engine. The pressure pump 39 plays a role of supplying liquid fuel from a fuel tank 43 to the common rail 37 under high pressure. For example, in the fuel injection system 35 for use in engine application, liquid fuel is fed to the common rail 37 under high pressure of about 1000 to 2000 atmospheres (about 101 MPa to about 203 MPa), and preferably high pressure of about 1500 to 1700 atmospheres (about 152 MPa to about 172 MPa). The common rail 37 stores therein the high-pressure fuel from the pressure pump 39 and acts to feed it to the injection device 19 on an as needed basis. As has already been described, the injection device 19 injects fluid in a certain amount to the exterior of the device or into an adjacent container through the injection hole 21. For example, in the case where an engine is a target of fuel supply by injection, high-pressure fuel in fine-spray form is injected into the combustion chamber of the engine through the injection hole 21.

It is to be understood that the application of the invention is not limited to the specific embodiments described heretofore, and that various changes and modifications can be made without departing from the gist of the invention. For example, while, in the foregoing embodiments, a single external electrode 9 is formed on each of the opposite side surfaces of the stacked body 7, it is possible to form two external electrodes 9 on adjacent side surfaces, respectively, or on the same side surface. Moreover, while, in the foregoing embodiments, the stacked body 7 has a rectangular sectional profile as viewed in a direction perpendicular to the stacked direction, the sectional profile may be defined by a polygon such as a hexagon or octagon, a circle, or a combination of a straight line and an arc, instead.

For example, the multi-layer piezoelectric element 1 according to the embodiment concerned is used for a driving element (piezoelectric actuator), a sensor element, a circuit element, and so forth. Examples of the driving element include a fuel injection device for an automotive engine, a liquid injection device such as an ink-jet system, a precise positioning device such as an optical device, and an anti-vibration device. Examples of the sensor element include a combustion pressure sensor, a knocking sensor, an acceleration sensor, a load sensor, an ultrasound sensor, a pressure-sensing element, and a yaw-rate sensor. Examples of the circuit element include a piezoelectric gyroscope, a piezoelectric switch, a piezoelectric transformer, and a piezoelectric breaker.

EXAMPLES

A piezoelectric actuator comprising the multi-layer piezoelectric element according to the invention was fabricated in the following manner. To begin with, a slurry was prepared by mixing calcined powder of piezoelectric ceramic composed predominantly of lead zirconate titanate ($PbZrO_3$—$PbTiO_3$) having an average particle size of 0.4 μm, a binder, and a plasticizer. Using the slurry, ceramic green sheets each having a thickness of 100 μm, which turn to piezoelectric layers 3, are prepared by the doctor blade method.

Moreover, a conductive paste which turns to internal electrode layers was prepared by adding a binder to a silver-palladium alloy.

Next, the conductive paste which turns to internal electrode layers was printed on one side of each ceramic green sheet by means of screen printing, and 300 ceramic green sheets bearing the printed conductive paste were stacked on top of each other. The resultant body has been fired at a temperature of 980 to 1100° C., whereupon a stacked body was obtained.

The stacked body thus obtained has been ground into a rectangular prism which is 8 mm long, 8 mm wide, and 30 mm tall with use of a surface grinder. Subsequently, a silver-glass containing conductive paste was applied to a side surface of the stacked body in a location where an external electrode is to be formed, followed by baking treatment at a temperature of 650° C. In this way, a external electrode having a thickness of 20 μm and a width of 2 mm was formed.

After that, a conductive paste, which contains a resin adhesive prepared by dispersing scaly silver powder having an average particle size of 5 μm in polyimide resin, was printed on the surface of the external electrode by means of screen printing, followed by drying treatment. Subsequently, a resin adhesive-containing conductive paste was pattern-printed on the surface only in a portion corresponding to a projection among the projections and depressions formed repeatedly in the stacked direction, by means of screen printing, followed by leveling treatment and drying treatment. After that, baking treatment has been performed thereon at a temperature of 200° C. In this way, a conductive connection member having a width of 2 mm was formed on the surface of the external electrode.

The surface of the conductive connection member thus obtained comprised projections and depressions in which the average height of the projections was 25 μm, and the average depth of the depressions was 25 μm. The thickness from a surface of the conductive connection member on a side contacting with the external electrode to the bottom of the depression was 50 μm. Moreover, the periodic interval (cycle) of the projections and depressions was 400 μm on average. In this way, there was constructed the piezoelectric actuator having the conductive connection member whose surface has projections and depressions formed repeatedly in the stacked direction (test sample numbered 2).

In addition, by way of Comparative Example constituting departure from the scope of the invention, a piezoelectric actuator comprising a conductive connection member free of surface projections and depressions (test sample numbered 1) was fabricated. Although the test sample was basically constructed in conformity with the aforestated multi-layer piezoelectric-element manufacturing method of the invention, its conductive connection member was formed without performing pattern-printing of a conductive paste for the formation of projections.

Next, in each of the multi-layer piezoelectric elements, a lead was fixedly connected to the end portion of the conductive connection member in the stacked direction with use of the aforestated resin adhesive-containing conductive paste.

After that, in each of the multi-layer piezoelectric elements, a DC electric field of 3 kV/mm has been applied to the external electrode via the conductive connection member for 15 minutes to perform polarization treatment. In this way, the piezoelectric actuators employing the multi-layer piezoelectric element were fabricated. Upon the application of DC voltage of 160 V to the piezoelectric actuators thus obtained, a displacement of 40 μm took place in the stacked direction of the stacked body. Moreover, the piezoelectric actuators were experimentally driven continuously $1\times10^8$ cycles at ambient temperature under application of AC voltage ranging from 0 V to +160 V at a frequency of 150 Hz. Experimental results are listed in Table 1.

TABLE 1

| Sample number | Presence of surface projections and depressions of conductive connection member | Condition after $1 \times 10^8$ cycles of driving |
|---|---|---|
| 1 | Absent | Breaking occurred in conductive connection member and sparking occurred |
| 2 | Present | No problem |

As shown in Table 1, in the piezoelectric actuator of test sample 1 implemented by way of Comparative Example of the invention, since the surface of the conductive connection member formed on the surface of the external electrode did not have projections and depressions formed repeatedly in the stacked direction, after $1\times10^8$ cycles of driving, the conductive connection member became unable to withstand extension and contraction of the stacked body, with the consequence that a crack appeared and propagated, and breaking occurred in the conductive connection member and sparking occurred.

On the other hand, in the piezoelectric actuator of test sample 2 implemented by way of Example of the invention, since the surface of the conductive connection member formed on the surface of the external electrode had the projections and depressions formed repeatedly in the stacked direction, stress caused by extension and contraction of the stacked body was absorbed by the projections and depressions. As a result, even after $1\times10^8$ cycles of driving, no crack appeared in the conductive connection member, and thus abnormality such as occurrence of sparking was not observed.

Further, piezoelectric actuators in which a part of an external lead member is embedded in the projections of the conductive connection member were fabricated in the following manner. The piezoelectric actuator was constructed basically in the same manner as in the piezoelectric actuator of test sample 2, but, following the completion of formation of the external electrode, the surface of the external electrode was coated evenly with a conductive paste which is identical with the resin adhesive-containing conductive paste used in the construction of the piezoelectric actuator of test sample 2. Subsequently, the external lead member was placed on the surface of the resin adhesive-containing conductive paste. Moreover, in order to form projections so that a part of the external lead member can be embedded therein, a resin adhesive-containing conductive paste was pattern-printed on the surface, followed by drying treatment. After that, baking treatment has been performed at a temperature of 200° C. under the same conditions as those presented in the method of manufacturing the piezoelectric actuator of test sample 2.

At this time, the piezoelectric actuator of test sample 3 was provided with an external lead member constructed by arranging a plurality of phosphor bronze-made wire rods each having a thickness of 50 μm and a width of 50 μm parallely at a pitch of 400 μm in a direction perpendicular to the stacked direction (FIG. 7(a)).

The piezoelectric actuator of test sample 4 was provided with an external lead member constructed of phosphor bronze-made wire rods with a wire diameter of 50 μm woven in the form of plain-weave mesh of a 180-count thread, wherein the angle which the wire rod forms with the stacked direction is 45 degrees (FIG. 7(b)).

The piezoelectric actuator of test sample 5 was provided with an external lead member constructed by punching out parts of a phosphor bronze plate having a thickness of 50 μm by an etching technique for extensibility and contractility in the stacked direction (FIG. 7(c)).

After the piezoelectric actuators of test samples 3 to 5 were subjected to polarization treatment as described previously, the piezoelectric actuators of test samples 1 to 5 were experimentally driven continuously $1 \times 10^9$ cycles at ambient temperature under application of AC voltage ranging from 0 V to +160 V at a frequency of 150 Hz. Experimental results are listed in Table 2.

| | Reference Signs List |
|---|---|
| 1: | Multi-layer piezoelectric element |
| 3: | Piezoelectric layer |
| 5: | Internal electrode layer |
| 7: | Stacked body |
| 8: | Conductive connection member |
| 9: | External electrode |
| 10: | External lead member |
| 19: | Injection device |
| 21: | Injection hole |
| 23: | Housing (Container) |
| 25: | Needle valve |
| 27: | Fluid passage |
| 29: | Cylinder |
| 31: | Piston |
| 33: | Disc spring |
| 35: | Fuel injection system |
| 37: | Common rail |
| 39: | Pressure pump |
| 41: | Injection control unit |
| 43: | Fuel tank |

TABLE 2

| Sample number | Presence of surface projections and depressions of conductive connection member | External lead member embedded in projections | Condition after $1 \times 10^8$ cycles of driving | Condition after $1 \times 10^9$ cycles of driving |
|---|---|---|---|---|
| 1 | Absent | — | Breaking occurred in conductive connection member and sparking occurred | — |
| 2 | Present | Absent | No problem | Displacement was reduced to 5/6 |
| 3 | Present | Parallel wire-rod form | No problem | No problem |
| 4 | Present | Mesh form | No problem | No problem |
| 5 | Present | Metal-plate form with extensibility and contractility in stacked direction | No problem | No problem |

As shown in Table 2, in the piezoelectric actuators of test samples 3 to 5 employing the multi-layer piezoelectric element according to the invention wherein a part of the external lead member was embedded in the projections of the undulations in the conductive connection member, even after $1 \times 10^9$ cycles of continuous driving under harsh conditions, no breaking occurred in the external electrode, and these piezoelectric actuators were excellent in long-term reliability.

On the other hand, in the piezoelectric actuator comprising the conductive connection member free of surface projections and depressions (test sample 1), after $1 \times 10^8$ cycles of continuous driving, breaking occurred in the conductive connection member and sparking occurred.

In the piezoelectric actuator having the conductive connection member in which its surface had projections and depressions formed repeatedly in the stacked direction, but a part of the external lead member was not embedded in the projections of the undulations (test sample 2), after $1 \times 10^8$ cycles of continuous driving, the displacement of the stacked body was reduced to five-sixth the intended amount.

The invention claimed is:

1. A multi-layer piezoelectric element, comprising:
a stacked body configured so that piezoelectric layers and internal electrode layers are alternately laminated;
an external electrode bonded to a side surface of the stacked body and electrically connected to the internal electrode layers; and
a conductive connection member attached to a surface of the external electrode,
a surface of the conductive connection member comprising projections and depressions formed repeatedly at least in a stacked direction of the stacked body,
the surface of the external electrode comprising projections and depressions formed repeatedly in the stacked direction of the stacked body,
a part of the surface of the external electrode which corresponds to one of the projections in the surface of the conductive connection member being one of the depressions,
the projections of the conductive connection member being located in an outer surface of the conductive connection member, and the depressions of the external electrode being located in an outer surface of the external electrode.

2. The multi-layer piezoelectric element according to claim 1, wherein the projections and depressions are arranged periodically in the stacked direction of the stacked body.

3. The multi-layer piezoelectric element according to claim 1, wherein one of the projections of the surface of the conductive connection member located in a midportion of the stacked body in the stacked direction thereof is higher than another one of the projections located in end portions thereof.

4. The multi-layer piezoelectric element according to claim 1, wherein a difference in level between the projections and depressions of the surface of the conductive connection member located in the midportion of the stacked body in the stacked direction thereof is larger than the difference located in end portions thereof.

5. The multi-layer piezoelectric element according to claim 1,
further comprising an external lead member,
wherein a part of the external lead member is embedded in the projections of the surface of the conductive connection member.

6. The multi-layer piezoelectric element according to claim 5, wherein, the part of the external lead member embedded in the conductive connection member is configured to be able to follow extension and contraction of the stacked body.

7. The multi-layer piezoelectric element according to claim 1, wherein the conductive connection member is formed of a conductive resin, the conductive resin being configured to disperse non-spherical conductive particles made of silver or an alloy composed predominantly of silver in a resin.

8. The multi-layer piezoelectric element according to claim 7, wherein the resin is a resin having an imide bond.

9. An injection device, comprising:
a container comprising an injection hole; and
the multi-layer piezoelectric element according to claim 1, wherein
a fluid stored in the container is injected through the injection hole by driving of the multi-layer piezoelectric element.

10. A fuel injection system, comprising:
a common rail configured to store high-pressure fuel;
the injection device according to claim 9, configured to inject the high-pressure fuel stored in the common rail;
a pressure pump configured to supply the high-pressure fuel to the common rail; and
an injection control unit configured to send a driving signal to the injection device.

11. A multi-layer piezoelectric element, comprising:
a stacked body configured so that piezoelectric layers and internal electrode layers are alternately laminated;
an external electrode bonded to a side surface of the stacked body and electrically connected to the internal electrode layers; and
a conductive connection member attached to a surface of the external electrode,
a surface of the conductive connection member comprising projections and depressions formed repeatedly at least in a stacked direction of the stacked body,
the surface of the external electrode comprising projections and depressions formed repeatedly in the stacked direction of the stacked body,
a part of the surface of the external electrode which corresponds to one of the depressions in the surface of the conductive connection member being one of the projections,
the depressions of the conductive connection member being located in an outer surface of the conductive connection member, and the projections of the external electrode being located in an outer surface of the external electrode.

12. A multi-layer piezoelectric element, comprising:
a stacked body configured so that piezoelectric layers and internal electrode layers are alternately laminated;
an external electrode bonded to a side surface of the stacked body and electrically connected to the internal electrode layers;
a conductive connection member attached to a surface of the external electrode; and
an external lead member,
a surface of the conductive connection member comprising projections and depressions formed repeatedly at least in a stacked direction of the stacked body,
a part of the external lead member being embedded in the projections of the surface of the conductive connection member,
the external lead member extending from the side surface of the stacked body outward in a direction different from the stacked direction of the stacked body.

* * * * *